United States Patent
Peterson et al.

(10) Patent No.: US 12,547,072 B2
(45) Date of Patent: Feb. 10, 2026

(54) SELF-ALIGNED BUILD-UP PROCESSING

(71) Applicant: Geminatio, Inc., Schenectady, NY (US)

(72) Inventors: Brennan Peterson, Longmont, CO (US); Phillip D. Hustad, Longmont, CO (US)

(73) Assignee: GEMINATIO, INC., NY (US)

( * ) Notice: Subject to any disclaimer, the term of this patent is extended or adjusted under 35 U.S.C. 154(b) by 206 days.

(21) Appl. No.: 18/686,790

(22) PCT Filed: Aug. 25, 2022

(86) PCT No.: PCT/US2022/041548
§ 371 (c)(1),
(2) Date: Feb. 26, 2024

(87) PCT Pub. No.: WO2023/028245
PCT Pub. Date: Mar. 2, 2023

(65) Prior Publication Data
US 2024/0404828 A1    Dec. 5, 2024

Related U.S. Application Data

(60) Provisional application No. 63/236,844, filed on Aug. 25, 2021.

(51) Int. Cl.
G03F 7/00      (2006.01)
G03F 7/38      (2006.01)
(Continued)

(52) U.S. Cl.
CPC ............ *G03F 7/0035* (2013.01); *G03F 7/38* (2013.01); *G03F 7/40* (2013.01); *H01L 21/0271* (2013.01);
(Continued)

(58) Field of Classification Search
None
See application file for complete search history.

(56) References Cited

U.S. PATENT DOCUMENTS

| 2015/0132965 A1 | 5/2015 | deVilliers et al. |
| 2016/0064220 A1 | 3/2016 | Ogihara et al. |

(Continued)

FOREIGN PATENT DOCUMENTS

| EP | 3454122 | * | 3/2019 | ......... B81C 99/0095 |
| JP | 2020181226 A | | 11/2020 | |
| KR | 20180121839 A | | 11/2018 | |

OTHER PUBLICATIONS

Office Action issued in Korean Application No. 10-2024-7008026, mailed on Jul. 4, 2025 (14 pages).

(Continued)

*Primary Examiner* — Jiong-Ping Lu
(74) *Attorney, Agent, or Firm* — Osha Bergman Watanabe & Burton LLP

(57) ABSTRACT

A method of microfabrication includes providing a substrate having an existing pattern, wherein the existing pattern comprises features formed within a base layer such that a top surface of the substrate has features uncovered and the base layer is uncovered, depositing a selective attachment agent on the substrate, wherein the selective attachment agent includes a solubility-shifting agent, depositing a first resist on the substrate, activating the solubility shifting agent such that a portion of the first resist becomes insoluble to a first developer, developing the first resist using the first developer such that a relief pattern comprising openings is formed, wherein the openings expose the features of the existing layer, and executing a selective growth process that grows a selective-deposition material on the features and within the openings of the relief pattern to provide self-aligned selective deposition features.

14 Claims, 3 Drawing Sheets

(51) Int. Cl.
    *G03F 7/40* (2006.01)
    *H01L 21/027* (2006.01)
    *H01L 21/285* (2006.01)
    *H01L 21/32* (2006.01)
    *H01L 21/768* (2006.01)

(52) U.S. Cl.
    CPC ...... *H01L 21/0273* (2013.01); *H01L 21/0274* (2013.01); *H01L 21/28562* (2013.01); *H01L 21/32* (2013.01); *H01L 21/76816* (2013.01); *H01L 21/76834* (2013.01); *H01L 21/76879* (2013.01); *H01L 21/76897* (2013.01)

(56) References Cited

U.S. PATENT DOCUMENTS

| | | |
|---|---|---|
| 2018/0366406 A1 | 12/2018 | Olson et al. |
| 2019/0295903 A1 | 9/2019 | Clark et al. |
| 2019/0318958 A1 | 10/2019 | Bristol et al. |
| 2020/0152472 A1 | 5/2020 | Devilliers et al. |
| 2021/0088904 A1 | 3/2021 | Devilliers et al. |

OTHER PUBLICATIONS

International Search Report issued in Application No. PCT/US2022/041548, mailed on Dec. 16, 2022 (6 pages).

Written Opinion issued in Application No. PCT/US2022/041548, mailed on Dec. 16, 2022 (4 pages).

International Preliminary Report on Patentability issued in Application No. PCT/US2022/041548, mailed on Feb. 27, 2024 (5 pages).

Office Action issued in Japanese Application No. 2024-537798, mailed on Mar. 11, 2025 (9 pages).

Office Action issued in Japanese Application No. 2024-537798, mailed on Sep. 2, 2025 (5 Pages).

* cited by examiner

SELF-ALIGNED BUILD-UP PROCESSING

BACKGROUND

Microfabrication of semiconductor devices includes various steps such as film deposition, pattern formation, and pattern transfer. Materials and films are deposited on a substrate by spin coating, vapor deposition, and other deposition processes. Pattern formation is typically performed by exposing a photo-sensitive film, known as a photoresist, to a pattern of actinic radiation and subsequently developing the photoresist to form a relief pattern. The relief pattern then acts as an etch mask, which, when one or more etching processes are applied to the substrate, cover portions of the substrate that are not to be etched. After a first etch, processing can then continue with additional steps of material deposition, etching, annealing, photolithography, and so forth, with various steps repeated until a transistor or integrated circuit is fabricated.

There are multiple steps in semiconductor processing where critical features must be exactly aligned to underlying layers. Conventionally, the different processes may be aligned by aligning different mask layers, correcting their positioning, and then etching the layers into place.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a method of microfabrication including providing a substrate having an existing pattern, wherein the existing pattern comprises features formed within a base layer such that a top surface of the substrate has features uncovered and the base layer is uncovered, depositing a selective attachment agent on the substrate, wherein the selective attachment agent comprises a solubility-shifting agent, depositing a first resist on the substrate, activating the solubility shifting agent such that a portion of the first resist becomes insoluble to a first developer, developing the first resist using the first developer such that a relief pattern comprising openings is formed, wherein the openings expose the features of the existing layer, and executing a selective growth process that grows a selective-deposition material on the features and within the openings of the relief pattern to provide self-aligned selective deposition features.

Other aspects and advantages of the claimed subject matter will be apparent from the following description and the appended claims.

DETAILED DESCRIPTION

Figure 1:
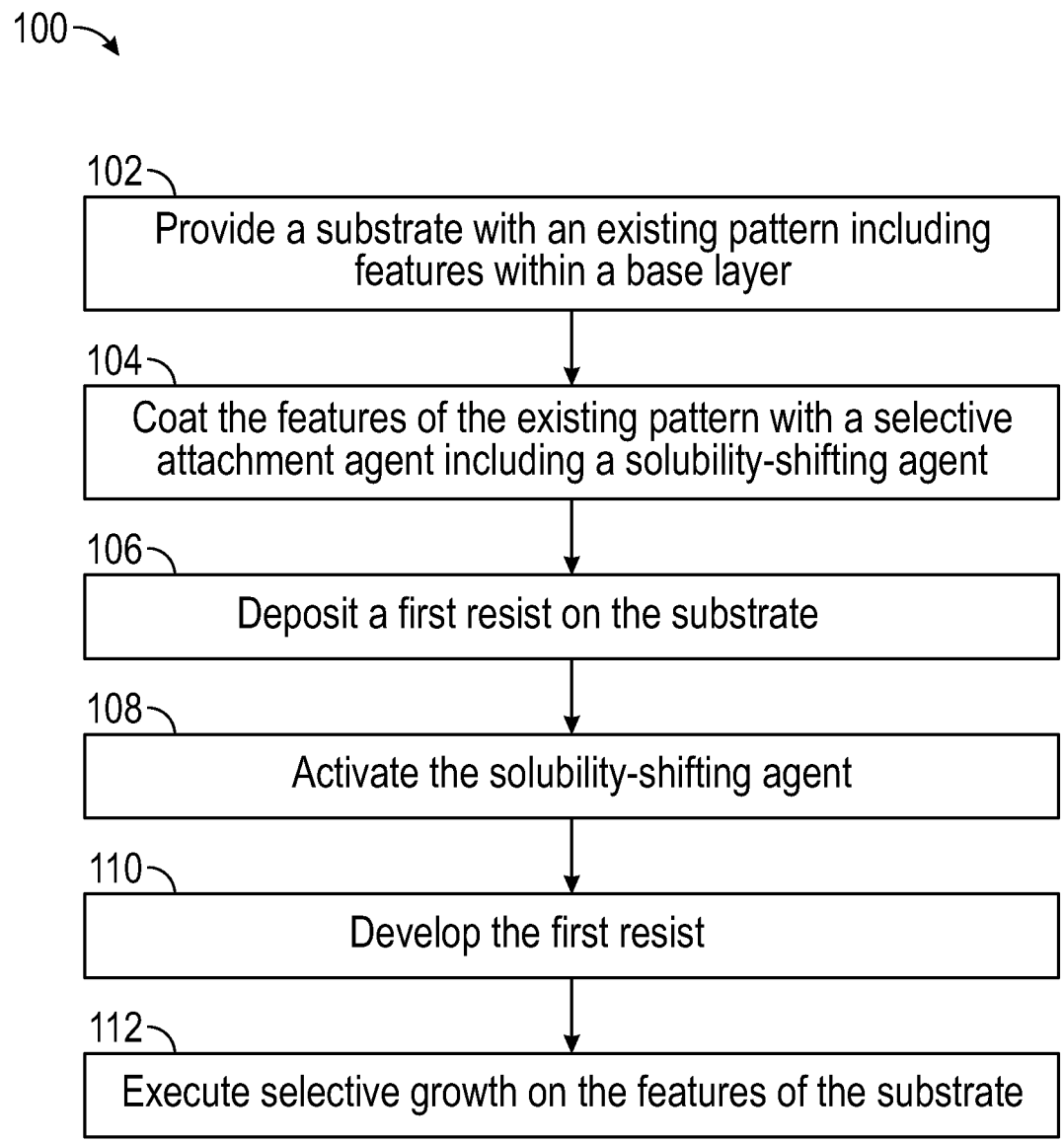
FIG. 1 is a block-flow diagram of a method in accordance with one or more embodiments of the present disclosure.

In microfabrication of devices and nodes, it is desirable that some features are fully aligned using selective processing. A typical example is vias on top of metal. That is, the vias are desirably precisely positioned without extending to the oxide. A via is an electrical connection between metal layers in a device. In selective deposition processes, it is desirable to grow a preselected material, defect free, in a predefined direction, at a predefined place. However, current directed growth techniques such as selective atomic layer deposition, suffer from large defectivity. Additionally, such techniques are often insufficient for use in more complex cases, such as a selected growth area that extends to a sidewall of a spacer. Current self-aligned growth, tends in general, grows in all directions. With material grown in all (available) direction, growing specific features is difficult. Often only extremely thin features can be grown as desired. Moreover, self-aligned growth often has a high defectivity rate. Even small amounts of unintentional deposition can create a problem for devices.

The present disclosure generally relates to a method of selective growth on a semiconductor substrate. Herein, the terms "semiconductor substrate" and "substrate" are used interchangeably, and may be any semiconductor material including, but not limited to, semiconductor wafers, semiconductor material layers, and combinations thereof. The method disclosed herein provides a core self-alignment feature that is used to generate full self-aligned features or partially self-aligned features. In one or more embodiments, the method combines selective feature placement and selective growth. The method may enable filling various feature and opening filling and facilitate shallow trench isolation deposition.

Methods disclosed herein provide a self-aligned deposition method that intrinsically protects regions that are not to receive deposits. Such methods may result in lower selectivity requirements for selective deposition. In one or more embodiments, partially aligned features or features without clear openings will still be contactable, for example as metal contacts. Further, using the present method, low spatial density features may be coated and filled, which may create simpler integration through much of the microfabrication process.

Methods of one or more embodiments, in relying on both chemical processes and diffusional properties, provide the unique ability to add control features to the input chemistry itself, and the process of measuring such chemistry.

As will be appreciated by one of ordinary skill in the art, the method disclosed herein may be used to provide various self-aligned features such as, for example, self-aligned universal, selected self-aligned, and feature self-aligned. Thus, specific embodiments described herein are not intended to limit the scope of the present disclosure. In one or more particular embodiments, a method for universal self-aligned vias is provided.

A method, 100, for universal self-alignment in accordance with the present disclosure is shown in, and discussed with reference to, FIG. 1. Initially, an existing pattern including features within a base layer is provided on a substrate at block 102. At block 104, the substrate, or a portion thereof, is coated with a selective attachment agent. The selective attachment agent may include a solubility-shifting agent. Then, at block 106, the substrate is coated with a first resist. At block 108, the solubility-shifting agent may be activated to provide a region of the first resist that is soluble in a first developer. Then, the first resist is developed at block 110 to provide gaps in the first resist exposing features of the existing pattern of the substrate. Finally, at block 112, selective growth on the features is executed. In some embodiments, after selective growth, the substrate is etched to remove any residual coating such as the selective attachment agent and the first resist.

Schematic depictions of a coated substrate at various points during the method described above are shown in FIGS. 2A-E. Herein "a coated substrate" refers to a substrate that is coated with one or more layers, such as a first resist layer and a second resist layer. FIG. 2A shows a substrate including an existing pattern. FIG. 2B shows a substrate including an overcoat including a selective attachment agent. FIG. 2C shows a substrate including a selective attachment agent overcoat layered with a first resist. FIG. 2D shows a coated substrate after the first resist has been developed, such that the features of the substrate are exposed. Finally, FIG. 2E shows a substrate including a first resist and a selective growth layer on top of the features of the substrate. The method of FIG. 1 and coated substrates shown in FIGS. 2A-E are discussed in detail below.

Figure 2A:
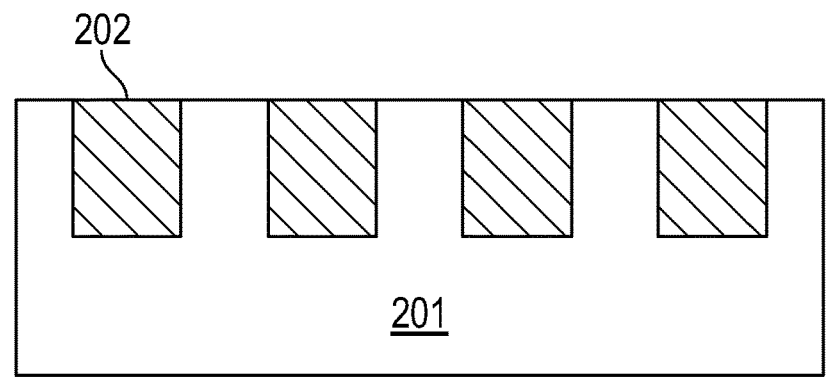
FIGS. 2A-E are schematic illustrations of coated substrates at respective points of a method in accordance with one or more embodiments of the present disclosure.
Figure 2B:
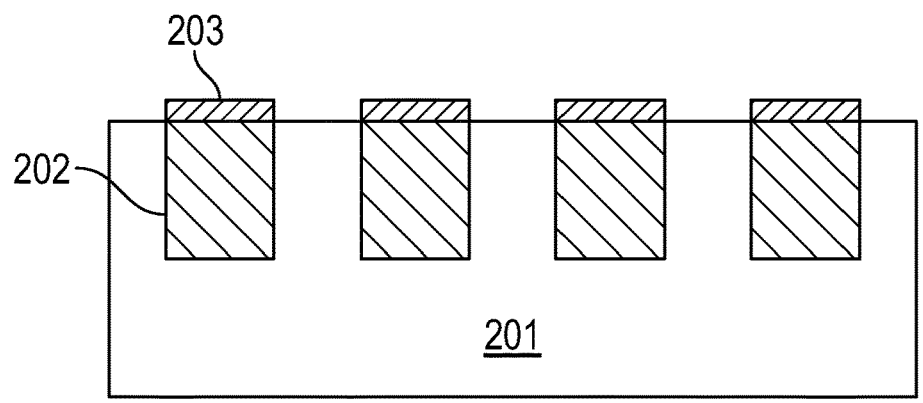
Figure 2C:
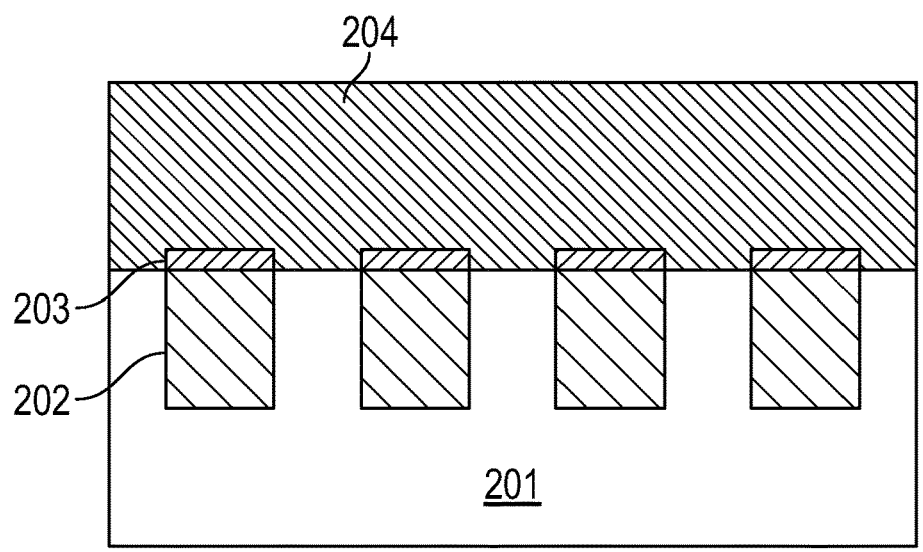
Figure 2D:
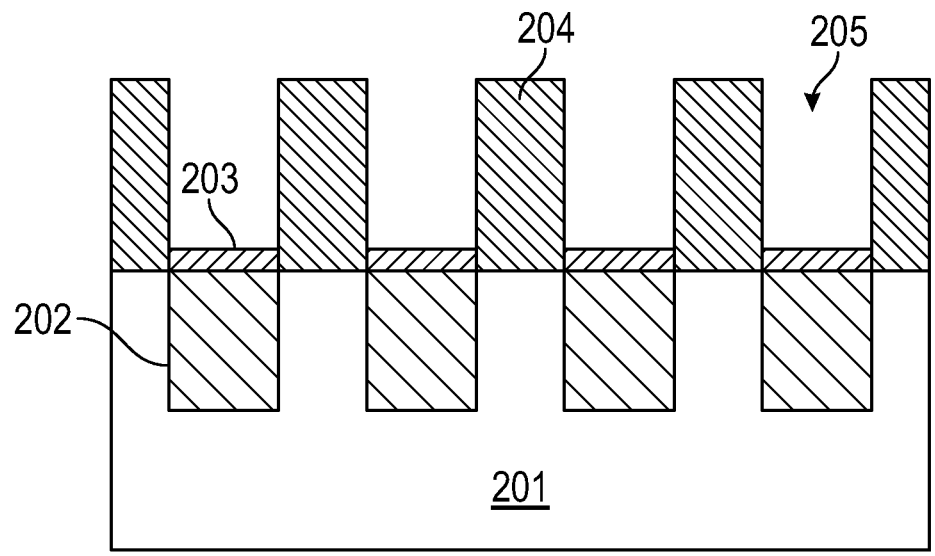
Figure 2E:
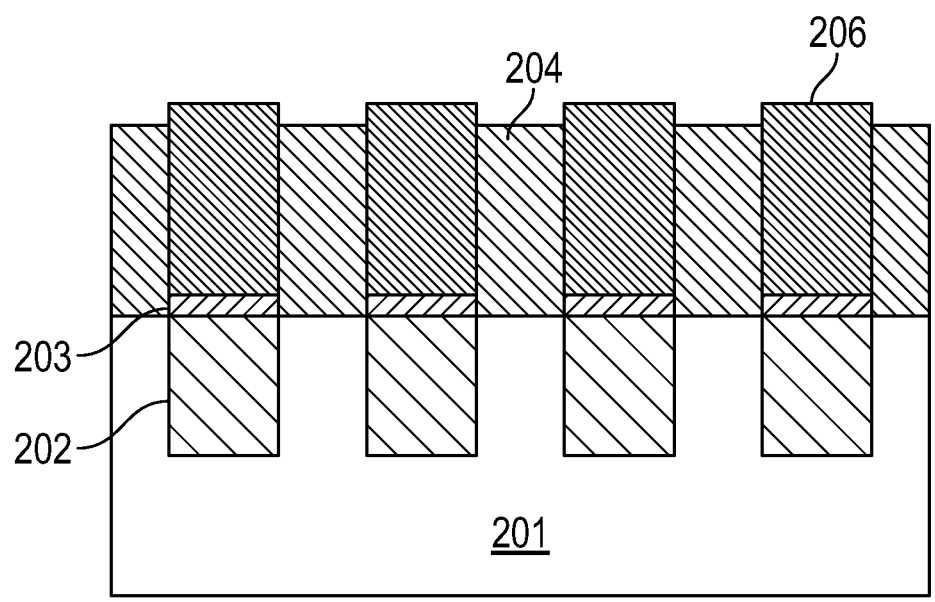

In FIG. 1, at block 102, an existing pattern is provided on a substrate. FIG. 2A shows a substrate including an existing pattern. In FIG. 2A, the existing pattern includes features 202 formed in a base layer 201. The base layer may be a suitable substrate known in the art. In one or more embodiments, the features formed in the base layer are in a large array. For example, on a square base layer, the features may be evenly spaced in a 4×4 array, a 5×5 array, a 6×6 array, and so forth. The shape and size of the array is not particularly limited and may be any shape and size suitable for use on a photolithography track.

The features may be made of any material commonly used in the art. In one or more embodiments, the features include a metal, metalloid, or other conductive structure. As used herein, the term metal includes alloys, stacks, and other combinations of multiple metals. For example, the metal interconnect lines may include barrier layers, stacks of different metals or alloys, etc. Suitable metals and metalloids that may make up the features include, but are not limited to, silicon, polysilicon, copper, cobalt and tungsten. In one or more embodiments, the base layer is an interlayer dielectric. A suitable interlayer dielectric may include oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The existing pattern may be a final feature or an intermediate feature in the patterning process. The substrate may be planarized such that the existing pattern of features within a base layer is exposed and accessible. In one or more embodiments, the substrate includes an etch-stop layer above a metal line, or a graphene coating.

Then, at block 104, a selective attachment agent is coated on the substrate, or a portion thereof. FIG. 2B shows a substrate including an existing pattern that is coated with a selective attachment agent 203. The selective attachment agent may be coated over the substrate by any coating method known in the art. Suitable coating methods include, but are not limited to, vapor phase deposition, liquid phase deposition, gas phase deposition, spin-on coating, and Langmuir-Blodgett monolayer coating.

The selective attachment agent may preferentially adhere to one material of the existing pattern. In one or more embodiments, the selective attachment agent adheres to the features of the existing pattern of the substrate. In such embodiments, the selective attachment agent may adhere to the features of the pattern in a ratio greater than 1:1 features to first layer. By way of example and not limitations, the selective attachment agent may adhere to the features of the pattern in a ratio ranging from about 2:1 to about 10:1 or more, features to first layer.

In one or more embodiments, the selective attachment agent is a chemical functional group that may by further functionalized. Exemplary selective attachment agents include, but are not limited to, alcohols, silanols, amines, phosphines, phosphonic acids, and carboxylic acids. The specific selective attachment agent coated on the existing pattern may depend on the particular chemistry used in other components of method 100. For example, various phosphonic acids and esters are able to react selectively or at least preferentially with metal surfaces, either native or oxidized, to form strongly bound metal phosphonates preferentially or even selectively over surfaces of dielectric materials (e.g., oxides of silicon) and thus may be used as a selectively attachment agent to the features rather than the base layer. A specific example of a suitable phosphonic acid is octadecylphosphonic acid (ODPA). Such surface coatings generally tend to be stable in many organic solvents but may be removed using mild aqueous acid and base solutions. Phosphines (e.g., organophosphines) may also optionally be used. Other common acids such as sulfonic acids, sulfinic acids and carboxylic acids may also be optionally used.

Another example of a reaction that is selective or at least preferential to metal materials as compared to dielectric materials or organic polymeric materials or other materials, are various metal corrosion inhibitors, such as, for example those used during chemical mechanical polishing to protect interconnect structures. Specific examples include benzotriazole, other triazole functional groups, other suitable heterocyclic groups (e.g., heterocyclic based corrosion inhibitors), and other metal corrosion inhibitors known in the arts. In addition to triazole groups, other functional groups may be used to provide the desired attraction or reactivity toward the metals. Various metal chelating agents are also potentially suitable. Various amines (e.g., organoamines) are also potentially suitable.

Yet another example of a reaction that is selective or at least preferential to metal materials as compared to dielectric materials or organic polymeric materials or other materials, are various thiols. As another example, 1,2,4-triazole or similar aromatic heterocycle compounds may be used to react selectively with the metal as compared to dielectric and certain other materials. Selective attachment agents may also contain functional groups capable of reacting with a functional group of a polymer to bond the polymer to the surface. Various other metal poisoning compounds known in the arts may also potentially be used. It is to be appreciated that these are just a few illustrative examples, and that still other examples will be apparent to those skilled in the arts and having the benefit of the present disclosure. The selective attachment agent may also include a polymer containing any of the aforementioned functional groups capable of selective attachment, where the polymer has functional groups along the main chain or as an end group and forms a layer of polymer chains attached to the target material.

In one or more embodiments, the selective attachment agent may include a solubility-shifting agent. The composition of the solubility-shifting agent may depend on the selective attachment agent. As will be appreciated by one of ordinary skill in the art, any suitable solubility-shifting agent may be included in the selective attachment agent provided that the two materials do not react with each other. Generally, the solubility-shifting agent may be any chemical that activates with light or heat. For example, in some embodiments, the solubility-shifting agent includes an acid or acid generator. The acid or generated acid in the case of a TAG should be sufficient with heat to cause cleavage of the bonds of acid-decomposable groups of the polymer in a surface region of the first resist pattern to cause increased solubility of the first resist polymer in a specific developer to be applied. The acid or TAG is typically present in the composition in an amount of from about 0.01 to 20 wt % based on the total solids of the trimming composition.

Preferable acids are organic acids including non-aromatic acids and aromatic acids, each of which can optionally have fluorine substitution. Suitable organic acids include, for example: carboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxyalkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, and 1-heptanesulfonic acid.

Exemplary aromatic acids that are free of fluorine include wherein aromatic acids of the general formula (I):

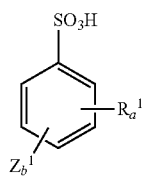

(I)

wherein: R1 independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z1 independently represents a group chosen from carboxyl, hydroxy, nitro, cyano, C1 to C5 alkoxy, formyl and sulfonic acid; a and b are independently an integer from 0 to 5; and a+b is 5 or less.

Exemplary aromatic acids may be of the general formula (II):

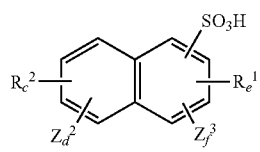

(II)

wherein: R2 and R3 each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; Z2 and Z3 each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less.

Additional aromatic acids that may be included in the solubility-shifting agent include those the general formula (III) or (IV):

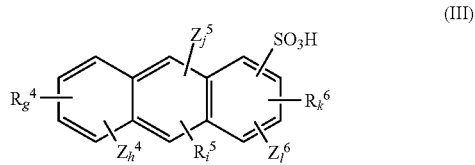

(III)

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+l is 3 or less;

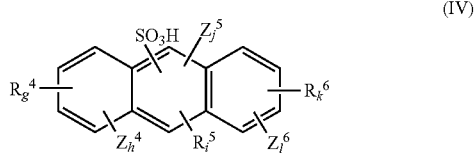

(IV)

wherein: R4, R5 and R6 each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; Z4, Z5 and Z6 each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; and k+l is 4 or less.

Suitable aromatic acids may alternatively be of the general formula (V):

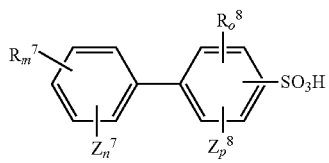

(V)

wherein: R7 and R8 each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; Z7 and Z8 each independently represents a group chosen from hydroxy, nitro, cyano, C1 to C5 alkoxy, formyl and sulfonic acid; m and n are independently an integer from 0 to 5; m+n is 5 or less; o and p are independently an integer from 0 to 4; and o+p is 4 or less.

Additionally, exemplary aromatic acids may have the general formula (VI):

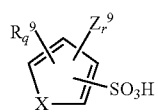

(VI)

wherein: X is O or S; R9 independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; Z9 independently represents a group chosen from carboxyl, hydroxy, nitro, cyano, C1 to C5 alkoxy, formyl and sulfonic acid; q and r are independently an integer from 0 to 3; and q+r is 3 or less.

In one or more embodiments, the acid is a free acid having fluorine substitution. Suitable free acids having fluorine substitution may be aromatic or nonaromatic. For example, free acid having fluorine substitution that may be used as solubility-shifting agent include, but are not limited to the following:

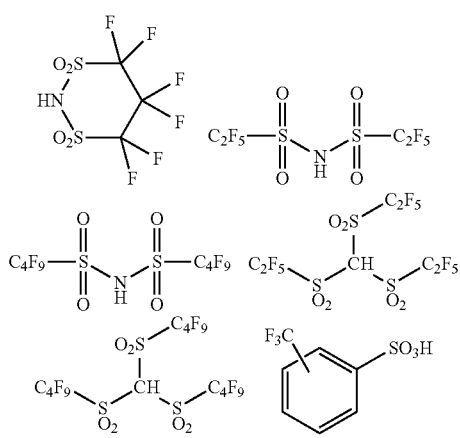

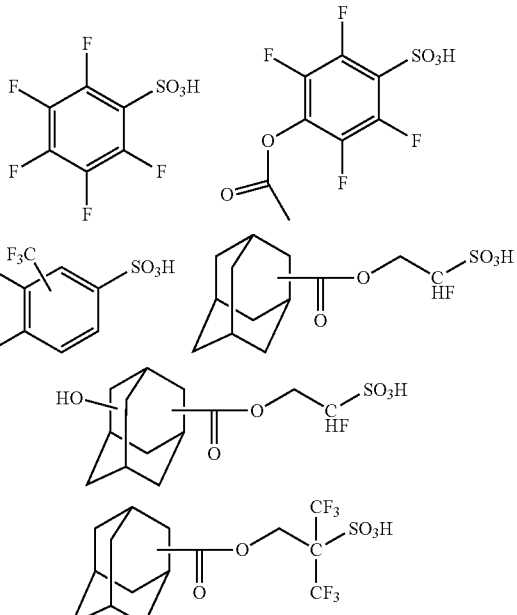

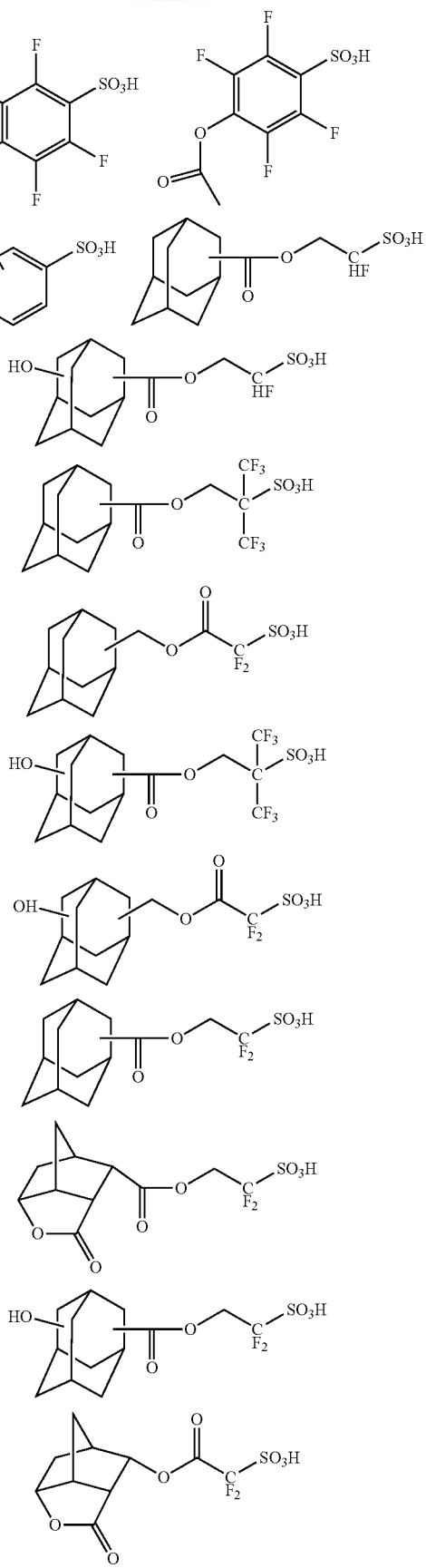

-continued
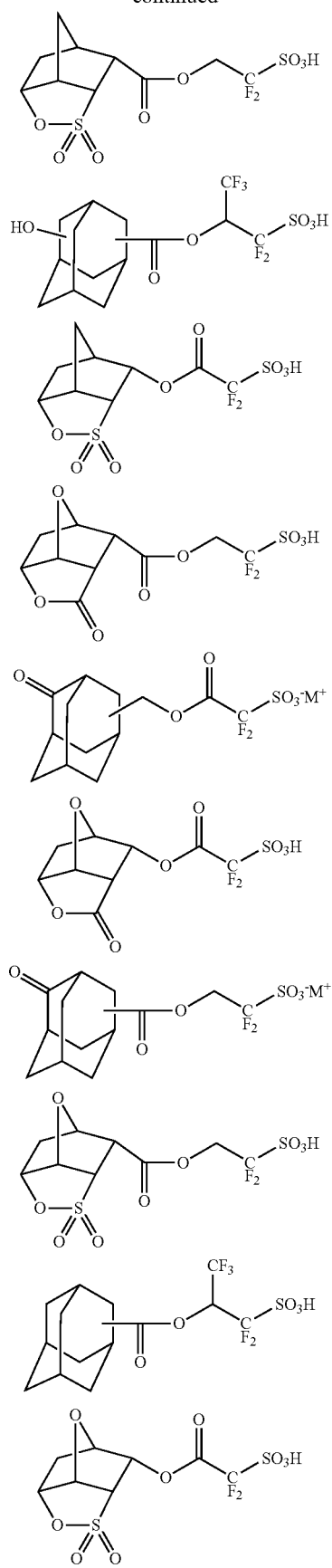
-continued
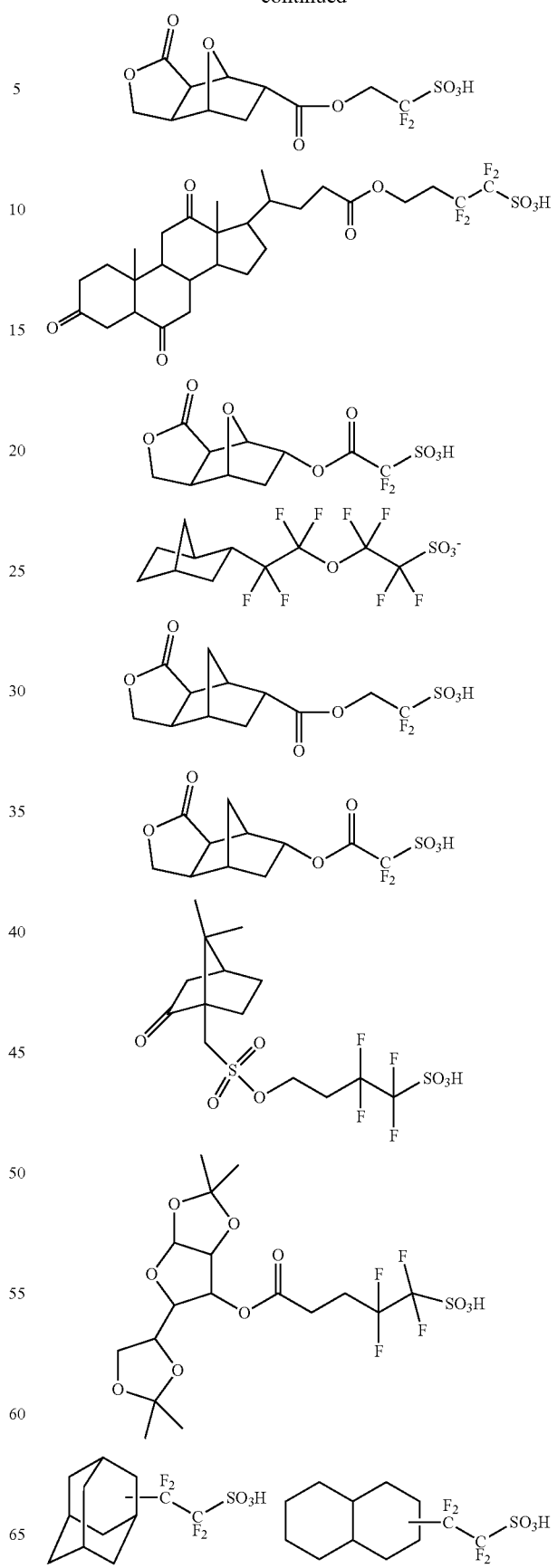

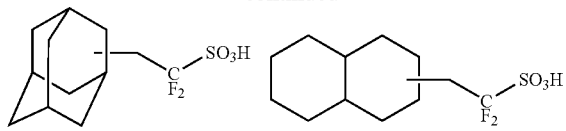

Suitable TAGs include those capable of generating a non-polymeric acid as described above. The TAG can be non-ionic or ionic. Suitable nonionic thermal acid generators include, for example, cyclohexyl trifluoromethyl sulfonate, methyl trifluoromethyl sulfonate, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, p-toluene sulfonic acid-pyridinium salts, sulfonate salts, such as carbocyclic aryl and heteroaryl sulfonate salts, aliphatic sulfonate salts, and benzenesulfonate salts. Compounds that generate a sulfonic acid upon activation are generally suitable. Preferred thermal acid generators include p-toluenesulfonic acid ammonium salts, and heteroaryl sulfonate salts.

Preferably, the TAG is ionic with a reaction scheme for generation of a sulfonic acid as shown below:

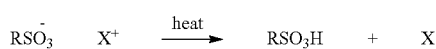

wherein $RSO_3^-$ is the TAG anion and $X^+$ is the TAG cation, preferably an organic cation. The cation can be a nitrogen-containing cation of the general formula (I):

(BH)$^+$                                           (I)

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "pKa" is used in accordance with its art-recognized meaning, that is, pKa is the negative log (to the base 10) of the dissociation constant of the conjugate acid (BH)$^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations (BH)$^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

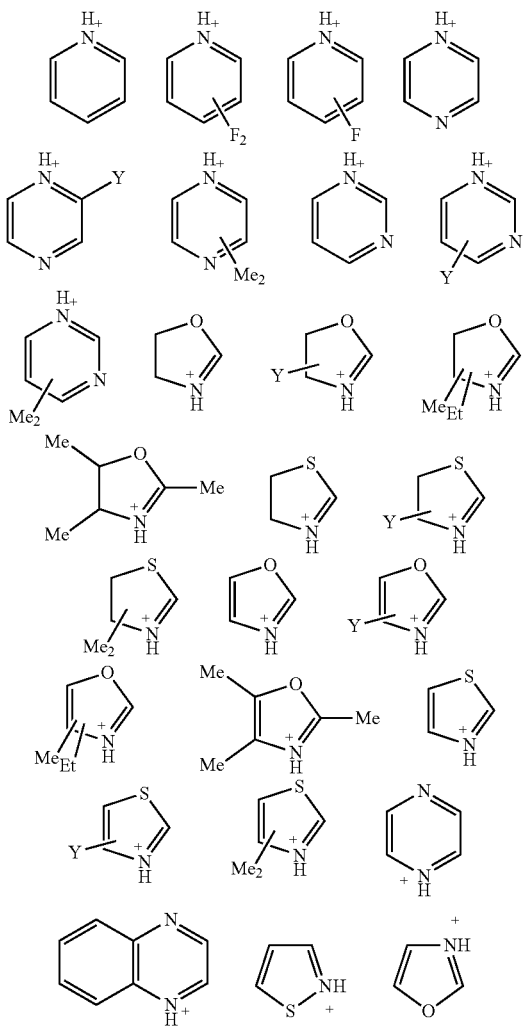

in which Y is alkyl, preferably, methyl or ethyl.

In particular embodiments, the solubility-shifting agent may be an acid such as trifluoromethanesulfonic acid, perfluoro-1-butanesulfonic acid, p-toluenesulfonic acid, 4-dodecylbenzenesulfonic acid, 2,4-dinitrobenzenesulfonic acid, and 2-trifluoromethylbenzenesulfonic acid; an acid generator such as triphenylsulfonium antimonate, pyridinium perfluorobutane sulfonate, 3-fluoropyridinium perfluorobutanesulfonate, 4-t-butylphenyltetramethylenesulfonium perfluoro-1-butanesulfonate, 4-t-butylphenyltetramethylenesulfonium 2-trifluoromethylbenzenesulfonate, and 4-t-butylphenyltetramethylenesulfonium 4,4,5,5,6,6-hexafluorodihydro-4H-1,3,2-dithiazine 1,1,3,3-tetraoxide; or a combination thereof.

Alternatively, the solubility-shifting agent may include a base or base generator. In such embodiments, suitable solubility-shifting agents include, but are not limited to, hydroxides, carboxylates, amines, imines, amides, and mixtures thereof. Specific examples of bases include ammonium carbonate, ammonium hydroxide, ammonium hydrogen phosphate, ammonium phosphate, tetramethylammonium carbonate, tetramethylammonium hydroxide, tetramethylammonium hydrogen phosphate, tetramethylammonium phosphate, tetraethylammonium carbonate, tetraethylammonium hydroxide, tetraethylammonium hydrogen phosphate, tetraethylammonium phosphate, and combinations thereof. Amines include aliphatic amines, cycloaliphatic amines, aromatic amines and heterocyclic amines. The amine may be a primary, secondary or tertiary amine. The amine may be a monoamine, diamine or polyamine. Suitable amines may include C1-30 organic amines, imines, or amides, or may be a C1-30 quaternary ammonium salt of a strong base (e.g., a hydroxide or alkoxide) or a weak base (e.g., a carboxylate). Exemplary bases include amines such as tripropylamine, dodecylamine, tris(2-hydroxypropyl)amine, tetrakis(2-hydroxypropyl)ethylenediamine; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), amides like tert-butyl 1,3-dihydroxy-2-(hydroxymethyl)propan-2-ylcarbamate and tert-butyl 4-hydroxypiperidine-1-carboxylateor; or ionic quenchers including quaternary alkyl ammonium salts such as tetrabutylammonium hydroxide (TBAH) or tetrabutylammonium lactate. In another embodiment, the amine is a hydroxyamine. Examples of hydroxyamines include hydroxyamines having one or more hydroxyalkyl groups each having 1 to about 8 carbon atoms, and preferably 1 to about 5 carbon atoms such as hydroxymethyl, hydroxyethyl and hydroxybutyl groups. Specific examples of hydroxyamines include mono-, di- and tri-ethanolamine, 3-amino-1-propanol, 2-amino-2-methyl-1-propanol, 2-amino-2-ethyl-1,3-propanediol, tris(hydroxymethyl)aminomethane, N-methylethanolamine, 2-diethylamino-2-methyl-1-propanol and triethanolamine.

Suitable base generators may be thermal base generators. A thermal base generator forms a base upon heating above a first temperature, typically about 140° C. or higher. The thermal base generator may include a functional group such as an amide, sulfonamide, imide, imine, O-acyl oxime, benzoyloxycarbonyl derivative, quaternary ammonium salt, nifedipine, carbamate, and combinations thereof. Exemplary thermal base generators include o-{(.beta.-(dimethylamino)ethyl)aminocarbonyl}benzoic acid, o-{(.gamma.-(dimethylamino)propyl)aminocarbonyl}benzoic acid, 2,5-bis{(.beta.-(dimethylamino)ethyl)aminocarbonyl}terephthalic acid, 2,5-bis{(.gamma.-(dimethylamino)propyl)aminocarbonyl}terephthalic acid, 2,4-bis{(.beta.-(dimethylamino)ethyl)aminocarbonyl}isophthalic acid, 2,4-bis{(.gamma.-(dimethylamino)propyl)aminocarbonyl}isophthalic acid, and combinations thereof.

Alternatively, in one or more embodiments, the solubility-shifting agent includes a crosslinker. Suitable crosslinkers that may be used as solubility-shifting agents include, but are not limited to, crosslinkers used for curing bis-epoxides such as bisphenol A diglycidyl ether, 2,5-bis[(2-oxiranyl-methoxy)-methyl]-furan, 2,5-bis[(2-oxiranylmethoxy)methyl]-benzene, melamine, glycurils such as tetramethoxymethyl glycoluril and tetrabutoxymethyl glycoluril, benzoguanamine-based materials such as benzoguanamine, hydroxymethylbenzoguanamine, methylated hydroxymethylbenzoguanamine, ethylated hydroxymethylbenzoguanamine, and urea-based materials.

In one or more embodiments, the selective attachment agent includes a solvent. The solvent is typically chosen from water, organic solvents and mixtures thereof. In some embodiments, the solvent may include an organic-based solvent system comprising one or more organic solvents. The term "organic-based" means that the solvent system includes greater than 50 wt % organic solvent based on total solvents of the solubility-shifting agent composition, more typically greater than 90 wt %, greater than 95 wt %, greater than 99 wt % or 100 wt % organic solvents, based on total solvents of the solubility-shifting agent compositions. The solvent component is typically present in an amount of from 90 to 99 wt % based on the solubility-shifting agent composition.

Suitable organic solvents for the selective attachment agent composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic $C_4$-$C_9$ monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and propylene glycol monomethyl ether; esters such as alkyl esters having a total carbon number of from 4 to 10, for example, propylene glycol monomethyl ether acetate, alkyl propionates such as n-butyl propionate, n-pentyl propionate, n-hexyl propionate, and n-heptyl propionate, and alkyl butyrates such as n-butyl butyrate, isobutyl butyrate, and isobutyl isobutyrate; ketones such as 2,5-dimethyl-4-hexanone and 2,6-dimethyl-4-heptanone; and polyethers such as dipropylene glycol monomethyl ether and tripropylene glycol monomethyl ether; and mixtures containing one or more of these solvents.

In some embodiments, after coating the substrate with the selective attachment agent, the substrate is pretreated. The substrate may be pretreated to ensure attachment of the selective attachment agent to the surface of the features. The pretreatment may be a soft bake performed for about 30 to 90 seconds at a temperature ranging from 50 to 150° C.

After the selective attachment material is attached to the features, any excess material may be removed. As such, in one or more embodiments, after applying and optionally pretreating the selective attachment agent to the substrate, the substrate is rinsed to remove unused material.

Then, at block 106 of method 100, a first resist is deposited on the substrate. FIG. 2C shows a substrate 201 coated with a selective attachment agent 203 and a first resist 204. Generally, a resist is a chemically amplified photosensitive composition that comprises a polymer, a photoacid generator, and a solvent. In one or more embodiments, the first resist includes a polymer. The polymer may be any standard polymer typically used in resist material and may particularly be a polymer having acid-labile groups. The polymer may be a polymer made from monomers including vinyl aromatic monomers such as styrene and p-hydroxystyrene, acrylate, methacrylate, norbornene, and combinations thereof. For example, the polymer may be a polymer made from monomers including styrene, p-hydroxystyrene, acrylate, methacrylate, norbornene, and combinations thereof. Monomers that include reactive functional groups may be present in the polymer in a protected form. For example, the —OH group of p-hydroxystyrene may be protected with a tert-butyloxycarbonyl protecting group. Such protecting group may alter the reactivity and solubility of the polymer included in the first resist. As will be appreciated by one having ordinary skill in the art, various protecting groups may be used for this reason. Acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-decomposable groups", "acid-cleavable groups," "acid-cleavable protecting groups," "acid-labile protecting groups," "acid-leaving groups," and "acid-sensitive groups."

The acid-labile group which, on decomposition, forms a carboxylic acid on the polymer is preferably a tertiary ester group of the formula —C(O)OC($R^1$)$_3$, or an acetal group of the formula —C(O)OC($R^2$)$_2$O$R^3$, wherein: $R^1$ is each independently linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, each $R^1$ optionally including as part of its structure one or more groups chosen from —O—, —C(O)—, —C(O)—O—, or —S—, and any two $R^1$ groups together optionally forming a ring; $R^2$ is independently hydrogen, fluorine, linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably hydrogen, linear $C_{1-6}$ alkyl, branched $C_{3-6}$ alkyl, or monocyclic or polycyclic $C_{3-10}$ cycloalkyl, each of which is substituted or unsubstituted, each $R^2$ optionally including as part of its structure one or more groups chosen from —O—, —C(O)—, —C(O)—O—, or —S—, and the $R^2$ groups together optionally forming a ring; and $R^3$ is linear $C_{1-20}$ alkyl, branched $C_{3-20}$ alkyl, monocyclic or polycyclic $C_{3-20}$ cycloalkyl, linear $C_{2-20}$ alkenyl, branched $C_{3-20}$ alkenyl, monocyclic or polycyclic $C_{3-20}$ cycloalkenyl, monocyclic or polycyclic $C_{6-20}$ aryl, or monocyclic or polycyclic $C_{2-20}$ heteroaryl, preferably linear $C_{1-6}$ alkyl, branched $C_{3-6}$ alkyl, or monocyclic or polycyclic $C_{3-10}$ cycloalkyl, each of which is substituted or unsubstituted, $R^3$ optionally including as part of its structure one or more groups chosen from —O—, —C(O)—, —C(O)—O—, or —S—, and one $R^2$ together with $R^3$ optionally forming a ring. Such monomer is typically a vinyl aromatic, (meth)acrylate, or norbornyl monomer. The total content of polymerized units comprising an acid-decomposable group which forms a carboxylic acid group on the polymer is typically from 10 to 100 mole %, more typically from 10 to 90 mole % or from 30 to 70 mole %, based on total polymerized units of the polymer.

The polymer can further include as polymerized a monomer comprising an acid-labile group, the decomposition of which group forms an alcohol group or a fluoroalcohol group on the polymer. Suitable such groups include, for example, an acetal group of the formula —COC($R^2$)$_2$O$R^3$—, or a carbonate ester group of the formula —OC(O)O—, wherein R is as defined above. Such monomer is typically a vinyl aromatic, (meth)acrylate, or norbornyl monomer. If present in the polymer, the total content of polymerized units comprising an acid-decomposable group, the decomposition of which group forms an alcohol group or a fluoroalcohol group on the polymer, is typically from 10 to 90 mole %, more typically from 30 to 70 mole %, based on total polymerized units of the polymer.

In some embodiments, the first resist has a composition similar to that of a positive tone developed (PTD) resist. In such embodiments, the first resist may include a polymer made from the above-described monomers, wherein one or more monomers including a reactive functional group are protected. As such, a PTD-like first resist may be organic soluble.

In other embodiments in which the solubility-shifting agent is a crosslinker, the first resist is a negative resist. In such embodiments, the first resist may include a polymer made from the above-described monomers, wherein any monomers including a reactive functional group are not protected. Suitable reactive functional groups include, but are not limited to, alcohols, carboxylic acids, amines, and epoxides. Exposure to a crosslinker results in crosslinking of the polymer, rendering the polymer insoluble to developers. The uncrosslinked areas can then be removed using an appropriate developer.

In other embodiments, the first resist is a negative tone developed (NTD) resist. Similar to PTD resists, NTD resists may include a polymer made from the above-described monomers, wherein one or more monomers including a reactive functional group are protected. As such, an NTD first resist may be organic soluble, but instead of developing the solubility-shifted regions with a first resist developer that is basic, the solubility-shifted regions remain but the regions containing protected functional groups are removed using a first resist developer comprising an organic solvent. Suitable organic solvents that may be used as a first resist developer include n-butyl acetate (NBA) and 2-heptanone. The tone of the resist (i.e., PTD vs. negative vs. NTD) may influence the final pattern placement.

In one or more embodiments, the first resist is layered on the substrate such that it has a thickness of about 300 Å to about 3000 Å.

At block 108 of method 100, the solubility-shifting agent is activated. In embodiments in which the solubility-shifting agent is an acid, acid generator, base, or base generator, activation of the solubility-shifting agent includes diffusing the solubility-shifting agent into the first resist to provide a solubility-shifted region of the first resist. The solubility-shifted region of the first resist may be dictated by the preferential adhesion of the selective attachment agent. For example, a selective attachment agent that preferentially adheres to the features of the existing pattern, may provide a solubility-shifted region of the first resist that is above the features. In one or more embodiments, the solubility-shifted region of the first resist extends vertically from the surface of the selective attachment agent coated on the feature to the surface of the first resist. In one or more embodiments, the solubility-shifted region extends in a sloped direction. When the solubility-shifted region extends in a sloped direction, it may be desirable to prevent the features from merging together. To accomplish this, the feature thickness may be controlled to be sufficiently thin.

In one or more embodiments, diffusion of the solubility-shifting agent into the first resist is achieved by performing a bake. The bake may be carried out with a hotplate or oven. The temperature and time of the bake may depend on the identity of the second resist, and the desired amount of diffusion of the solubility-shifting agent into the second resist. Suitable conditions for the bake may include a temperature ranging from about 50° C. to about 160° C., and a time ranging from about 30 seconds to about 90 seconds.

In embodiments in which the solubility-shifting agent is a crosslinker, activation of the solubility-shifting agent includes initiating polymerization of the crosslinker into the first resist. Activation of a crosslinker may provide a crosslinked region of the first resist. The crosslinked region of the first resist may be dictated by the preferential adhesion of the selective attachment agent. For example, when the selective attachment agent preferentially adheres to the features of the existing pattern, as in selective patterning self-alignment, the crosslinked region of the first resist may be above the features.

Then, at block 110 of method 100, the first resist is developed using a specific developer. The specific developer may be any developer commonly used in the art. The composition of the specific developer may depend on the tone and solubility characteristics of the first resist. For example, if the first resist is a positive tone developed resist, the specific developer may be a base such as tetramethylammonium hydroxide. On the other hand, if the first resist is a negative tone developed resist, the specific developer may be a nonpolar organic solvent, such as n-butyl acetate or 2-heptanone.

In one or more embodiments, the solubility-shifted or crosslinked region is insoluble in the first developer. Accordingly, after developing the first resist, the solubility-shifted or crosslinked region of the first resist may remain on the substrate. Alternatively, in one or more embodiments, the solubility-shifted region becomes soluble in the first developer. In such embodiments, after developing the first resist, the solubility-shifted region of the first resist is removed from the substrate. Such pattern may be referred to as an anti-selective pattern as the features of the resist remain above the base layer, which was not coated with the selective attachment agent.

In one or more embodiments, the solubility-shifted region of the first resist is soluble in the first developer. In such embodiments, development of the first resist results in a pattern of the first resist that includes gaps exposing the features of the existing pattern. As such, the selective attachment agent is exposed and accessible for further coating. FIG. 2D shows a coated substrate in which gaps 205 in the first resist 204 expose the features 202 of the existing pattern. In one or more embodiments, a rinse strips remaining selective attachment agent before metallization.

Finally, at block 112 of method 100, selective growth on the features of the existing pattern is executed. Any suitable selective growth technique known in the art may be used to provide a second set of features directly over the features of the existing pattern. In FIG. 2E, a substrate is shown including feature 202, a first resist 204 offset form the features and a selective growth material 206 on top of the features.

In one or more embodiments, the second set of features include a selective growth material. Many different types of selective growth deposition materials known in the art are suitable for the various embodiments disclosed herein. In some embodiments, selective metal-on-metal reactive depositions may be accomplished in solution using techniques such as electroless metal deposition and/or electrochemical atomic layer deposition. Examples of suitable metals for such metal-on-metal reactive depositions include, but are not limited to, copper (Cu), nickel (Ni), cobalt (Co), iron (Fe), manganese (Mn), chromium (Cr), titanium (Ti), tantalum (Ta), ruthenium (Ru), palladium (Pd), and various alloys, stacks, or other combinations thereof. Other metals that may be deposited by selective reaction using electroless metal depositions and/or electrochemical atomic layer depositions should also be generally suitable.

In some embodiments, the selective metal-on-metal reactive deposition may be performed with homoleptic metal diazabutadiene complexes $[M\{N(R)C(H)C(H)N(R')\}2]$. In this formula, M may represent a metal atom selected from nickel (Ni), cobalt (Co), iron (Fe), manganese (Mn), or chromium (Cr). The organic functional groups R and R' may represent any of various substituted or un-substituted alkyl or aryl functional groups. Examples of R and R' include, but are not limited to, substituted or un-substituted two to eight carbon alkyl groups, phenyl groups, and the like. Combinations of different complexes (e.g., having different metal atoms) may also optionally be used. A metal (e.g., a pure metal or an alloy or stack of multiple metals) may be deposited on a starting metal and/or on the metals deposited from these complexes by using chemical vapor deposition (CVD) either with or without a co-reactant (e.g., hydrogen ($H_2$), ammonia ($NH_3$), hydrazine, etc.). Atomic layer deposition (ALD) may alternatively be used. Such depositions will be generally selective compared to dielectric materials, semiconductor materials, and organic polymeric materials.

In some embodiments, an applied voltage and/or the photoelectric effect may be used to promote metal deposition and/or increase the selectivity of a metal deposition over a metal as compared to another material (e.g., a dielectric). In some embodiments, a voltage bias may be applied between a wafer or other substrate and conductive hardware in metal deposition equipment, for example, between a wafer chuck and a coil above a wafer on the wafer chuck. This voltage bias may be either direct current (DC) or alternating current (AC) for example radiofrequency AC. The applied voltage bias may tend to generate, reduce the energy needed to release, or otherwise provide electrons (e.g., secondary electrons) relatively more from a metal (e.g., an interconnect line or metal material formed over the interconnect line) than from another material (e.g., dielectric), for example, due in part to the photoelectric effect. In some embodiments, a forward voltage bias may be applied in order to help accelerate electrons in the direction away from the metal. When a DC voltage bias is used there is a possibility that the release of electrons may slow down after some electrons are emitted from the metal and it begins to have a net positive charge unless there is a conductive path to the metal. However, application of an AC voltage bias may generally help to avoid this by loading the metal back up with electrons in between cycles. The electrons may be used to promote metal deposition and/or increase the selectivity of a metal deposition over the metal as compared to another material (e.g., dielectric). The electrons may help to provide energy to drive or promote a selective metal deposition reaction, such as, for example, an ALD or CVD deposition of a metal or other metal deposition process that can be promoted by such generated electrons. In some embodiments, an ultraviolet light source may be used with the voltage bias to help further generate photoelectrons near the metal. This may further help to promote the metal deposition and metal deposition selectivity.

In some embodiments, selective dielectric-on-dielectric reactive depositions may be accomplished by solution phase techniques such as sol-gel processes. Selective dielectric-on-dielectric reactive depositions may also be accomplished by CVD, ALD, MLD, or other vapor phase techniques. Examples of suitable materials for such dielectric-on-dielectric reactive depositions include, but are not limited to, oxides of silicon (e.g., silicon dioxide ($SiO_2$)), carbon doped oxides of silicon, nitrides of silicon (e.g., silicon nitride (SiN)), carbides of silicon (e.g., silicon carbide (SiC)), carbo-nitrides of silicon (e.g., SiCN), oxides of aluminum (e.g., aluminum oxide ($Al_2O_3$)), oxides of titanium (e.g., titanium oxide ($TiO_2$)), oxides of zirconium (e.g., zirconium oxide ($ZrO_2$)), oxides of hafnium (e.g., hafnium oxide ($HfO_2$)), and combinations thereof, to name just a few illustrative examples. Other dielectric and low-k dielectric materials known in the arts are also potentially suitable. Carbosiloxane materials may also optionally be used. Various examples of reactions to deposit such materials selectively or at least preferentially as compared to metals using techniques such as sol-gel, ALD, CVD, and MLD, are known in the arts.

In some embodiments, one or more of carbon nanotubes, graphene, and graphite may be grown or formed over a metal surface material. The metal surface material may represent a catalytic metal surface material that is catalytic to growth of the carbon nanotubes, grapheme, or graphite. The catalytic metal surface material may be heated and exposed to suitable hydrocarbons and any other co-reactants using techniques known in the arts. One example of a suitable catalytic surface and set of reactants is a cobalt surface exposed to carbon monoxide and hydrogen. The voltage bias approach described above may also potentially be used to help promote such reactions.

In some embodiments, a passivant material or layer may optionally be applied or formed over one of the different surface materials in order to help increase the selectivity or preferentiality of the reaction to another of the surface materials. The use of such a passivant material generally helps to expand the number of possible selective/preferential reactions available to form the layers. Reactions not necessarily selective/preferential to one of the surface materials over the other, may nevertheless be selective to one of the surface materials as compared to the passivant material. By way of example, a passivant material may be applied to a first surface material but not on a second surface material in order to increase selectivity/preferentiality of a given deposition reaction to the second surface material as compared to the passivant material. Most passivant materials operable to be formed selectively over one of the materials and operable to increase the selectivity/preferentiality of the reaction should generally be suitable. Such passivants may be applied in vapor phase or solution phase. Such passivants may be applied once or multiple times during the selective deposition process. After the layer has been formed through the selective/preferential reaction, the passivant material may be removed. For example, the passivant material may be removed through a thermal, photolytic, chemical, or electrochemical treatment. In some embodiments, another passivant material may optionally be applied to other surface material, although this is not required. Again, the use of such passivant materials, which is optional, may help to expand the number of possible selective or at least preferential chemical reactions that may be used to form the various layers mentioned herein.

In one or more embodiments, after selective growth is executed on the features of the existing pattern, the substrate may be etched to remove any residual organic materials including the selective attachment agent, solubility-shifting agent, and resist. Then, dielectric isolation material may be deposited to fill in the new features formed by the selective growth process. Examples of suitable materials for such dielectric depositions include but are not limited to, oxides of silicon (e.g., silicon dioxide (SiO2)), carbon doped oxides of silicon, nitrides of silicon (e.g., silicon nitride (SiN)), carbides of silicon (e.g., silicon carbide (SiC)), carbo-nitrides of silicon (e.g., SiCN), oxides of aluminum (e.g., aluminum oxide (Al2O3)), oxides of titanium (e.g., titanium oxide (TiO2)), oxides of zirconium (e.g., zirconium oxide (ZrO2)), oxides of hafnium (e.g., hafnium oxide (HfO2)), and combinations thereof, to name just a few illustrative examples. Subsequently, a chemical-mechanical polishing process may be employed to planarize the surface. For example, if silicon dioxide is deposited, and an overburden is provided by such deposition, the overburden may be removed by chemical-mechanical polishing.

Accordingly, method 100 may provide self-aligned vias or metal contacts with a growth direction that is generally vertical due to the constraint applied by the surrounding first resist. resist In an alternative embodiment, the features are coated with a first selective attachment agent that contains a first solubility-shifting agent, and the base layer is coated with a second selective attachment agent that contains a second solubility-shifting agent. In some embodiments, the first solubility-shifting agent comprises an acid or acid generator and the second solubility-shifting agent comprises a base or base generator. The resist is then deposited on the substrate and the solubility-shifting agents are simultaneously activated. The first solubility-shifting agent diffuses from the top of the features and the second solubility-shifting agent from the top of the base layer. At the interface of the diffusion front, the solubility-shifting agents can interact with each other to prevent switching of solubility of the resist in lateral areas outside a vertical plane perpendicular to the substrate and located at the interface of the features and the exposed base layer. This helps constrain the switching of solubility to areas of the resist that are above the features, thereby limiting lateral growth of the openings and creating an approximately straight edge rather than a sloped profile.

In one or more embodiments, a method includes photolithography steps. Photolithographic steps can be used to select particular features, portions of features, or other regions. For example, selective placement and growth may be achieved using the directed growth process as in method 100, described above. Then, the first resist may be exposed to form a patterned array that exposes a target area and activates the solubility-shifting agent in that area. A thermal treatment then causes diffusion of the solubility-shifting agent through the layer of resist and facilitates the solubility-shifting reaction. The solubility-shifting agent (an acid, for example) makes the resist soluble, and that part is removed. Then, selective growth on the metal/substrate may be executed. Selective growth may be preceded by an etch step to remove any residual coating of the selective attachment agent and/or solubility-shifting agent from the tops of the uncovered features.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:

1. A method of microfabrication comprising:
providing a substrate having an existing pattern, wherein the existing pattern comprises features formed within a first layer such that a top surface of the substrate has the features uncovered and the first layer is uncovered;
depositing a selective attachment agent on the substrate, wherein the selective attachment agent comprises a solubility-shifting agent;
depositing a first resist on the substrate;
activating the solubility-shifting agent such that a portion of the first resist becomes insoluble to a first developer; and
developing the first resist using the first developer such that a relief pattern comprising openings is formed, wherein the openings expose the features of the existing layer; and
executing a selective growth process that grows a selective-deposition material on the features and within the openings of the relief pattern to provide self-aligned selective deposition features.

2. The method of claim 1, wherein the selective attachment agent adheres to surfaces of the features more than to surfaces of the first layer.

3. The method of claim 1, wherein the features formed within the first layer form a large array.

4. The method of claim 1, wherein the selective attachment agent comprises a phosphonic acid, phosphonate ester, a phosphine, a sulfonic acid, a sulfinic acid, a carboxylic acid, a triazole, a thiol, or a combination thereof.

5. The method of claim 1, wherein the solubility-shifting agent comprises an acid-generator.

6. The method of claim 5, wherein the acid-generator is free of fluorine.

7. The method of claim 5, wherein the acid-generator is selected from the group consisting of triphenylsulfonium antimonate, pyridinium perfluorobutane sulfonate, 3-fluoro-pyridinium perfluorobutanesulfonate, 4-t-butylphenyltetramethylenesulfonium perfluoro-1-butanesulfonate, 4-t-butylphenyltetramethylenesulfonium 2-trifluoromethylbenzenesulfonate, 4-t-butylphenyltetramethylenesulfonium 4,4,5,5,6,6-hexafluorodihydro-4H-1,3,2-dithiazine 1,1,3,3-tetraoxide, and combinations thereof.

8. The method of claim 1, wherein the solubility-shifting agent comprises an acid.

9. The method of claim 8, wherein the acid is free of fluorine.

10. The method of claim 8, wherein the acid is selected from the group consisting of trifluoromethanesulfonic acid, perfluoro-1-butanesulfonic acid, p-toluenesulfonic acid, 4-dodecylbenzenesulfonic acid, 2,4-dinitrobenzenesulfonic acid, 2-trifluoromethylbenzenesulfonic acid, and combinations thereof.

11. The method of claim 1, further comprising, prior to depositing the first resist on the substrate, pre-treating the substrate.

12. The method of claim 1, wherein the features comprise a metal or metalloid selected form the group consisting of silicon, polysilicon, copper, cobalt, tungsten, and combinations thereof.

13. The method of claim 1, wherein the substrate comprises a dielectric.

14. A method of microfabrication, the method comprising:
receiving a substrate having features formed within a first layer such that a top surface of the substrate has the features uncovered and the first layer uncovered;
depositing a first solubility-shifting agent on the substrate, the first solubility-shifting agent selected so that the first solubility-shifting agent adheres to uncovered surfaces of the features without adhering to uncovered surfaces of the first layer;
depositing a second solubility-shifting agent on the substrate, the second solubility-shifting agent selected so that the second solubility-shifting agent adheres to the uncovered surfaces of the first layer without adhering to uncovered surfaces of the features;
depositing a first photoresist on the substrate;
activating the first solubility-shifting agent sufficient to cause regions of the first photoresist above the features to become soluble to a particular developer;
activating the second solubility-shifting agent such that the second solubility-shifting agent increases insolubility of the first photoresist above the first layer;
developing the first photoresist resulting in a relief pattern that defines openings that uncover the features; and
executing a selective growth process that grows a selective-deposition material on the features and within the defined openings of the relief pattern resulting in self-aligned selective deposition features.

* * * * *